(12) United States Patent
Yang et al.

(10) Patent No.: US 11,127,756 B2
(45) Date of Patent: Sep. 21, 2021

(54) THREE-DIMENSIONAL MEMORY DEVICE AND MANUFACTURING METHOD THEREOF

(71) Applicant: MACRONIX International Co., Ltd., Hsinchu (TW)

(72) Inventors: Chih-Kai Yang, Kaohsiung (TW); Tzung-Ting Han, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 16/513,344

(22) Filed: Jul. 16, 2019

(65) Prior Publication Data

US 2021/0020650 A1     Jan. 21, 2021

(51) Int. Cl.
*H01L 27/11582*    (2017.01)
*H01L 27/02*       (2006.01)
*H01L 21/306*      (2006.01)
*H01L 21/04*       (2006.01)

(52) U.S. Cl.
CPC ...... *H01L 27/11582* (2013.01); *H01L 21/042* (2013.01); *H01L 21/30604* (2013.01); *H01L 27/0207* (2013.01)

(58) Field of Classification Search
CPC ........... H01L 27/11582; H01L 27/0207; H01L 21/30604; H01L 21/042; H01L 27/11548; H01L 27/11556; H01L 27/11575; H01L 27/1157
USPC ....................................................... 257/326
See application file for complete search history.

(56) References Cited

U.S. PATENT DOCUMENTS

| 2011/0151667 | A1* | 6/2011 | Hwang | H01L 23/5226 438/667 |
| 2014/0001530 | A1 | 1/2014 | Song | |
| 2018/0240811 | A1 | 8/2018 | Kim et al. | |
| 2019/0006381 | A1 | 1/2019 | Nakatsuji et al. | |
| 2020/0251479 | A1* | 8/2020 | Sakakibara | H01L 23/5226 |

OTHER PUBLICATIONS

Office Action of Taiwan Counterpart Application, dated Feb. 27, 2020, pp. 1-6.

* cited by examiner

*Primary Examiner* — Hoang-Quan Ho
(74) *Attorney, Agent, or Firm* — J.C. Patents

(57) ABSTRACT

Provided is a three-dimensional memory device including a substrate, first and second stacked structures and an etching stop layer. The substrate has a cell region and a periphery region. The first stacked structure is disposed on the cell region and the periphery region, and has a first vertical channel pillar on the cell region that penetrates through the first stacked structure. The second stacked structure is located on the first stacked structure, is disposed on the cell region and the periphery region, and has a second vertical channel pillar on the cell region that penetrates through the second stacked structure. The second vertical channel pillar is electrically connected to the first vertical channel pillar. The etching stop layer is located between the first and second stacked structures, is disposed on the cell region and extends onto the periphery region, and surrounds the lower portion of the second vertical channel pillar.

17 Claims, 13 Drawing Sheets

THREE-DIMENSIONAL MEMORY DEVICE AND MANUFACTURING METHOD THEREOF

BACKGROUND

Technical Field

The present invention is related to a semiconductor device and a manufacturing method thereof, and more generally to a three-dimensional memory device and a manufacturing method thereof.

Description of Related Art

Since a non-volatile memory (e.g., flash memory) has the advantage that stored data does not disappear at power-off, it becomes a widely used memory device for a personal computer or other electronics equipment.

Currently, the flash memory array commonly used in the industry includes a NOR flash memory and a NAND flash memory. Since the NAND flash memory has a structure in which memory cells are connected together in series, degree of integration and area utilization thereof are better than those of the NOR flash memory. Thus, the NAND flash memory has been widely used in a variety of electronic products. Besides, to further enhance the degree of integration of the memory device, a three-dimensional NAND flash memory is developed. However, there are still some challenges associated with the three-dimensional NAND flash memory.

SUMMARY

The present invention provides a three-dimensional memory device and a manufacturing method thereof, in which the total aspect ratio of the vertical channel pillars is increased by multiple etching steps, and an etching stop layer is disposed between two adjacent vertical channel pillars to widen the process window of misalignment, and thus, the device performance is improved.

The present invention provides a three-dimensional memory device that includes a substrate, first and second stacked structures and an etching stop layer. The substrate has a cell region and a periphery region. The first stacked structure is disposed on the cell region and the periphery region, and has a first vertical channel pillar on the cell region that penetrates through the first stacked structure. The second stacked structure is located on the first stacked structure, is disposed on the cell region and the periphery region, and has a second vertical channel pillar on the cell region that penetrates through the second stacked structure. The second vertical channel pillar is electrically connected to the first vertical channel pillar. The etching stop layer is located between the first and second stacked structures, is disposed on the cell region and extends onto the periphery region, and surrounds the lower portion of the second vertical channel pillar.

According to an embodiment of the present invention, the three-dimensional memory device further includes an insulating liner disposed between the etching stop layer and the first stacked structure and covering a portion of the first stacked structure, wherein the insulating liner and the etching stop layer are made by different material.

According to an embodiment of the present invention, the three-dimensional memory device further includes an insulating buffer layer, disposed on the insulating liner and aside the etching stop layer.

According to an embodiment of the present invention, a thickness of the etching stop layer is at least two times a thickness of the insulating liner.

According to an embodiment of the present invention, the first stacked structure includes a plurality of first insulating layers and a plurality of first gate layers stacked alternately, the second stacked structure includes a plurality of second insulating layers and a plurality of second gate layers stacked alternately, and portions of the first gate layers and the second gate layers protruding from the cell region form a staircase structure on the cell region.

According to an embodiment of the present invention, a thickness of the etching stop layer is greater than a thickness of the first gate layers or the second gate layers.

According to an embodiment of the present invention, the three-dimensional memory device further includes a plurality of first contacts located on the periphery region and electrically connected to the first gate layers, and a plurality of second contacts located on the periphery region and electrically connected to the second gate layers.

According to an embodiment of the present invention, a material of the etching stop layer includes oxide, nitride, or oxynitride.

According to an embodiment of the present invention, a material of the etching stop layer includes polysilicon, metal, metal silicide, alloy or a combination thereof.

According to an embodiment of the present invention, the three-dimensional memory device further includes a third contact located on the periphery region and electrically connected to the etching stop layer.

According to an embodiment of the present invention, the third contact is at a floating potential.

According to an embodiment of the present invention, the third contact is at an operating potential.

According to an embodiment of the present invention, the first stacked structure includes a plurality of first insulating layers and a plurality of first gate layers stacked alternately, and distances of the first gate layers protruding from the cell region are decreased as the first gate layers are gradually away from the substrate; the second stacked structure includes a plurality of second insulating layers and a plurality of second gate layers stacked alternately, and distances of the second gate layers protruding from the cell region are decreased as the second gate layers are gradually away from the substrate; and a distance of the etching stop layer protruding from the cell region is between a distance of the adjacent first gate layer protruding from the cell region and a distance of the adjacent second gate layer protruding from the cell region.

According to an embodiment of the present invention, the first vertical channel pillar includes a first charge storage structure disposed on a sidewall of a first opening that penetrates through the first stacked structure, a first insulating pillar disposed in the first opening, a first channel layer disposed between the first charge storage structure and the first insulating pillar, and a first conductive plug, disposed on the first insulating pillar and in contact with the first channel layer.

According to an embodiment of the present invention, the second vertical channel pillar includes a second charge storage structure disposed on a sidewall of a second opening that penetrates through the second stacked structure, a second insulating pillar disposed in the second opening, a second channel layer disposed between the second charge storage structure and the second insulating pillar, and a second conductive plug, disposed on the second insulating pillar and in contact with the second channel layer.

The present invention provides a manufacturing method of forming a three-dimensional memory device that includes the following steps. A substrate is provided, and the substrate has a cell region and a periphery region. A first stacked structure is formed on the substrate on the cell region and the periphery region. At least one first vertical channel pillar is formed through the first stacked structure on the cell region. An etching stop layer is formed on the first stacked structure on the cell region and the periphery region. A second stacked structure is formed on the etching stop layer on the cell region and the periphery region. At least one second vertical channel pillar is formed through through the second stacked structure on the cell region, and the second vertical channel pillar is electrically connected to the first vertical channel pillar.

According to an embodiment of the present invention, the etching stop layer surrounds a lower portion of the second vertical channel pillar.

According to an embodiment of the present invention, the manufacturing method further includes forming an insulating buffer layer aside the etching stop layer.

According to an embodiment of the present invention, the first stacked structure includes a plurality of first insulating layers and a plurality of first film layers stacked alternately, the second stacked structure includes a plurality of second insulating layers and a plurality of second film layers stacked alternately, and the method further includes replacing the first film layers with a plurality of first gate layers and replacing the second film layers with a plurality of second gate layers.

According to an embodiment of the present invention, the manufacturing method further includes replacing the insulating etching stop layer with a conductive etching stop layer.

In view of the above, in the three-dimensional memory device of the invention, after forming a first vertical channel pillar, an etching stop layer is formed, and then a second opening for forming a second vertical channel pillar is defined. The etching stop layer of the invention can widen the process window of the second opening, so as to avoid the etching damage to the underlying first vertical channel pillar caused by misalignment of the second opening, and therefore improve the device performance. In addition, the etching stop layer of the invention can be set as a floating node or an operation node based on the electrical requirement, thereby increasing the design flexibility of the product.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 2:
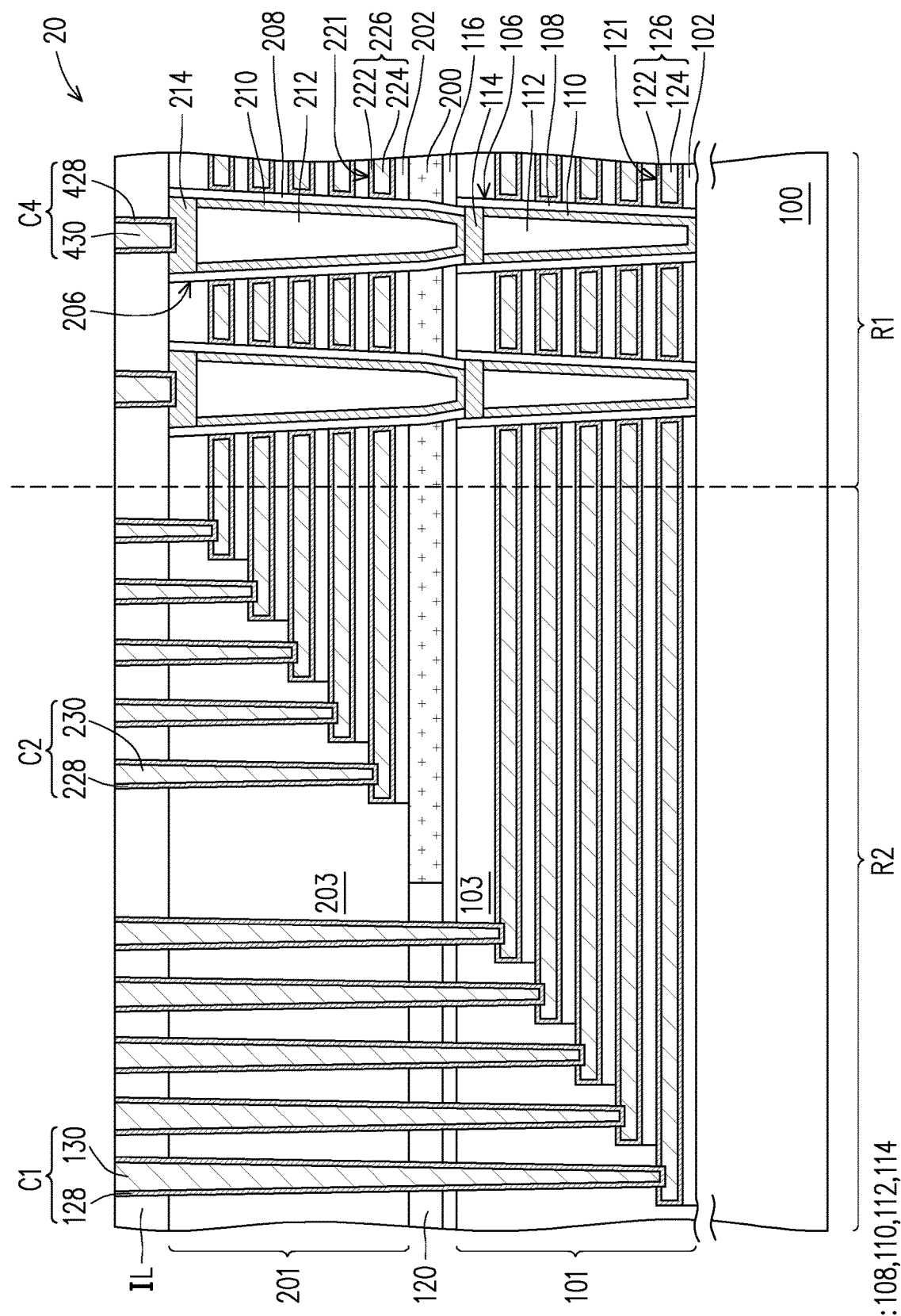
FIG. 2 is a schematic cross-sectional view of a three-dimensional memory device according to another embodiment of the present invention.
Figure 3:
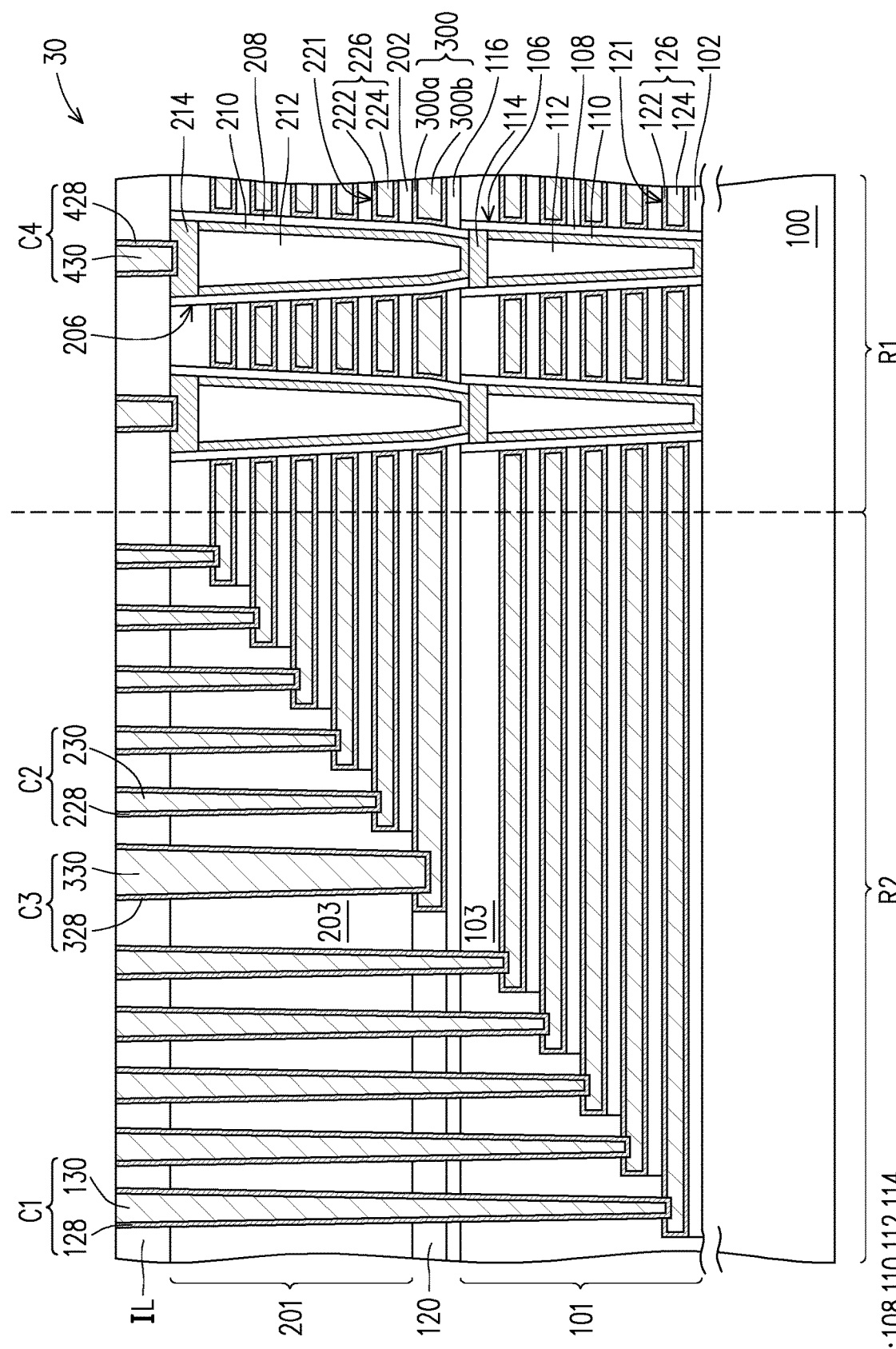
FIG. 3 is a schematic cross-sectional view of a three-dimensional memory device according to yet another embodiment of the present invention.

FIG. 1A to FIG. 1I are schematic cross-sectional views of a method of forming a three-dimensional memory device according to an embodiment of the present invention. FIG. 2 is a schematic cross-sectional view of a three-dimensional memory device according to another embodiment of the present invention. FIG. 3 is a schematic cross-sectional view of a three-dimensional memory device according to yet another embodiment of the present invention.

Figure 1A:
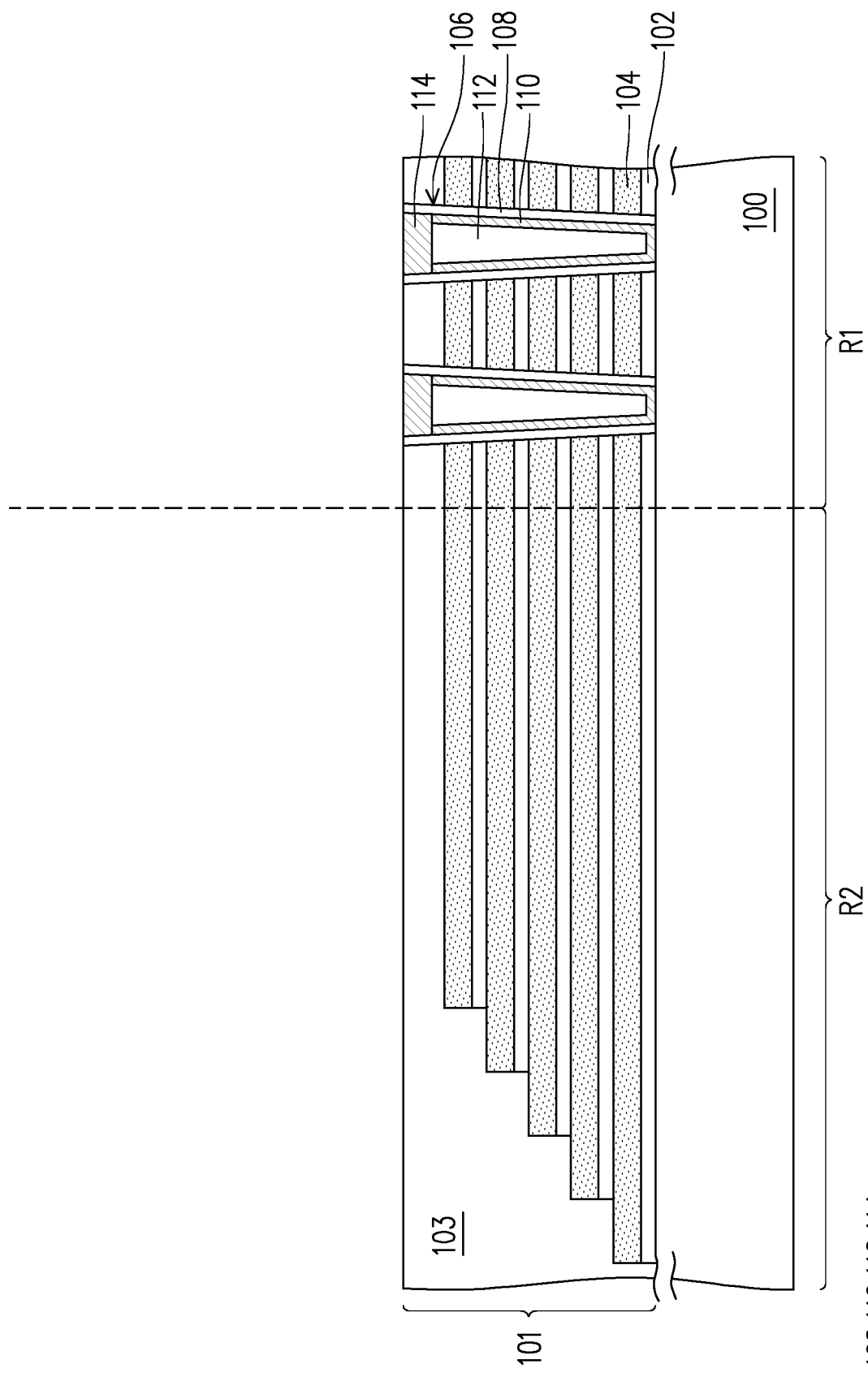
FIG. 1A to FIG. 1I are schematic cross-sectional views of a method of forming a three-dimensional memory device according to an embodiment of the present invention.

Referring to FIG. 1A, a substrate 100 is provided. The substrate 100 can be a semiconductor substrate, such as a silicon-containing substrate. In an embodiment, upon the design requirement, the substrate 100 has a doped region formed therein. In an embodiment, the substrate 100 has a cell region R1 and a periphery region R2.

Thereafter, a first stacked structure 101 is formed on the substrate 100. In an embodiment, the first stacked structure 101 is disposed on the cell region R1 and the periphery region R2. In an embodiment, the first stacked structure 101 includes a plurality of first insulating layers 102 and a plurality of first film layers 104 stacked alternately. In an embodiment, the material of the first insulating layers 102 includes silicon oxide, and the material of the first film layers 104 includes silicon nitride. In an embodiment, the distances of the first film layers 104 protruding from the cell region R1 are decreased as the first film layers 104 are gradually away from the substrate 100. The end portions of the first insulating layers 102 and the first film layers 104 constitute a first staircase structure. A first stepped insulating layer 103 fill up the other space of the first stacked structure 101.

A patterning process is then performed, so as to remove a portion of the stacked structure 101 on the cell region R1, and therefore form one or more first openings 106 penetrating through the first insulating layers 102 and the first film layers 104. In an embodiment, the first opening 106 can have a slightly inclined sidewall, as shown in FIG. 1A. In another embodiment, the first opening 106 can have a substantially vertical sidewall. In an embodiment, the first opening 106 is referred to as a first vertical channel (VC) hole.

Still referring to FIG. 1A, a first charge storage structure 108 is formed on the sidewall of the first opening 106, and the first charge storage structure 108 is in contact with the first insulating layers 102 and the first film layers 104. In an embodiment, the first charge storage structure 108 is an oxide-nitride-oxide (ONO) composite layer. In an embodiment, the first charge storage structure 108 is formed as a spacer on the sidewall of the first opening 106, and exposes the bottom surface of the first opening 106.

Thereafter, a first channel layer 110 is formed on the first charge storage structure 108. In an embodiment, the material of the first channel layer 110 includes polysilicon. In an embodiment, the first channel layer 110 covers the first charge storage structure 108 on the sidewall of the first opening 106, and is in contact with the substrate 100 exposed by the bottom surface of the first opening 106.

Afterwards, a first insulating pillar 112 is formed in the lower portion of the first opening 106. In an embodiment, the material of the first insulating pillar 112 includes silicon oxide.

Then, a first conductive plug 114 is formed in the upper portion of the first opening 106, and the first conductive plug 114 is in contact with the first channel layer 110. In an embodiment, the material of the first conductive plug 114 includes polysilicon.

Figure 1B:
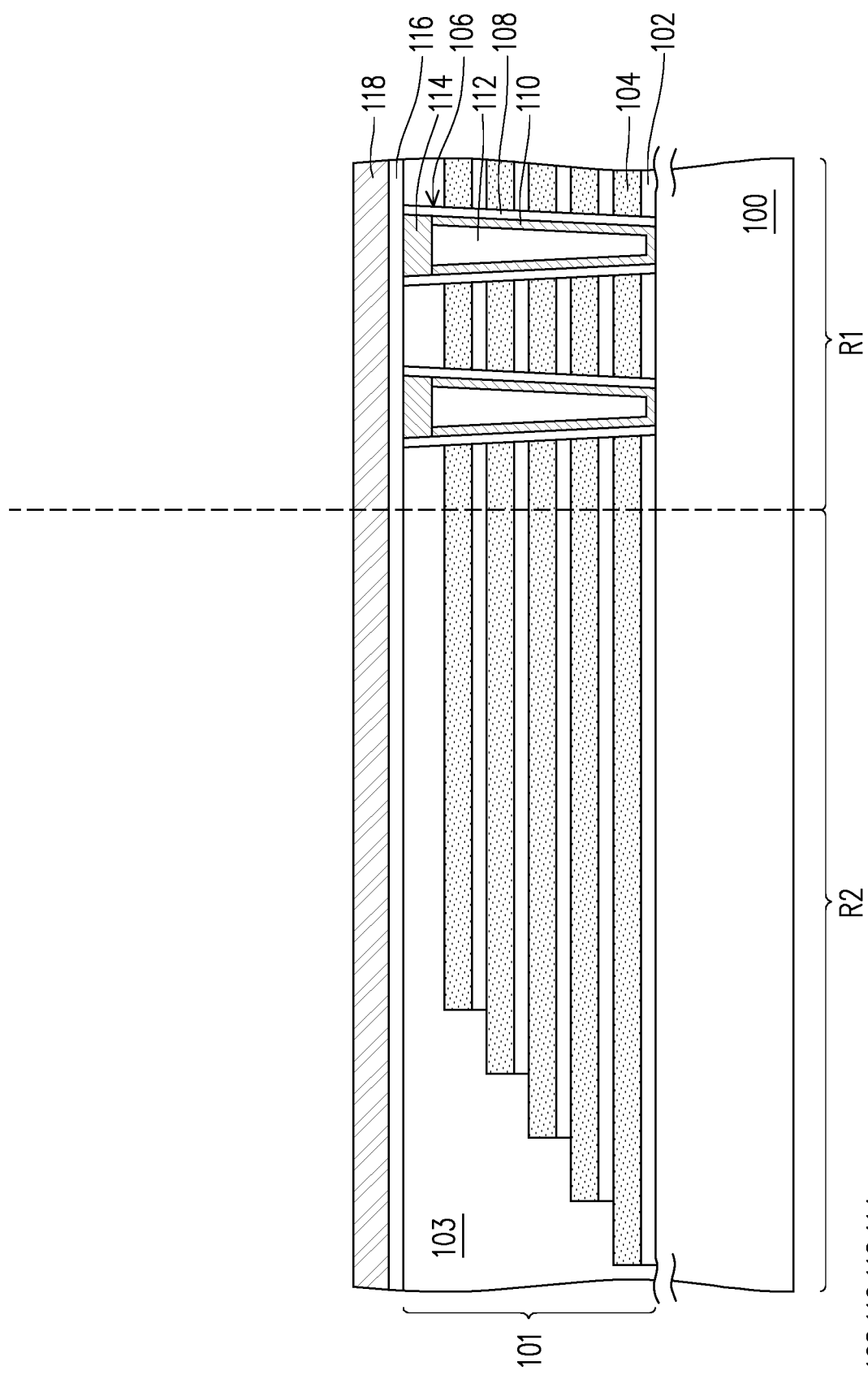

In an embodiment, an insulating liner 116 is further included. However, the present invention is not limited thereto. Referring to FIG. 1B, an insulating liner 116 is formed on the cell region R1 and the periphery region R2. Specifically, the insulating liner 116 covers the uppermost first insulating layer 102 of the first stacked structure 101 and the first conductive plug 114. In an embodiment, the material of the insulating liner 116 includes silicon oxide, and the forming method thereof includes performing a chemical vapor deposition process.

Thereafter, an etching stop layer 118 is formed on the insulating liner 116 on the cell region R1 and the periphery region R2. In an embodiment, the material of the etching stop layer 118 has a high etching selectivity with respect to that of the insulating liner 116. For example, the etching stop layer 118 is a polysilicon layer, and the insulating liner 116 is an oxide layer. In an embodiment, the material of the etching stop layer 118 includes conductive material, such as polysilicon, metal (e.g., tungsten), metal silicide (e.g., tungsten silicide), alloy or a combination thereof, and the forming method thereof includes performing a chemical vapor deposition process, but the present invention is not limited thereto. When the etching stop layer 118 is a conductor material, the insulating liner 116 can avoid shorting of the adjacent first conductive plugs 114. In addition, since the insulating liner 116 and the etching stop layer 118 are composed of different materials, the insulating liner 116 can serve as a protective layer to avoid the first stacked structure 101 from being damaged when the second opening 206 penetrates the etching stop layer 118 in the subsequent step. In an embodiment, the thickness of the etching stop layer 118 is, preferably, at least two times the thickness of the insulating liner 116.

Figure 1C:
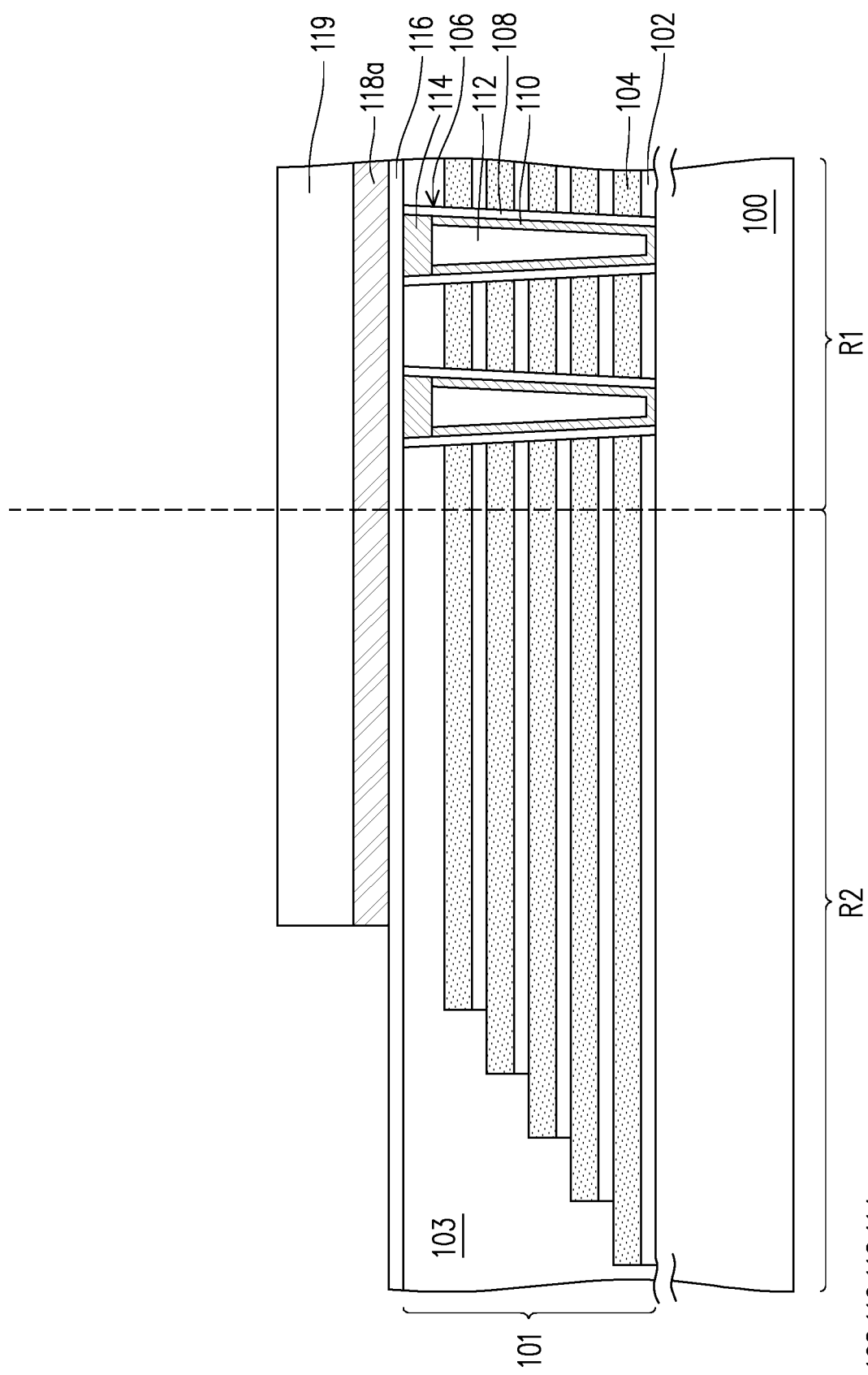

Referring to FIG. 1C, the etching stop layer 118 on the periphery region R2 is partially removed. In an embodiment, a photoresist layer 119 is formed on the substrate 100. Thereafter, the etching stop layer 118 uncovered by the photoresist layer 119 is removed by using the photoresist layer 119 as an etching mask, leaving an etching stop layer 118a. In an embodiment, the distance of the etching stop layer 118a protruding from the cell region R1 is less than the distances of the underlying first film layers 104 protruding from the cell region R1.

Figure 1D:
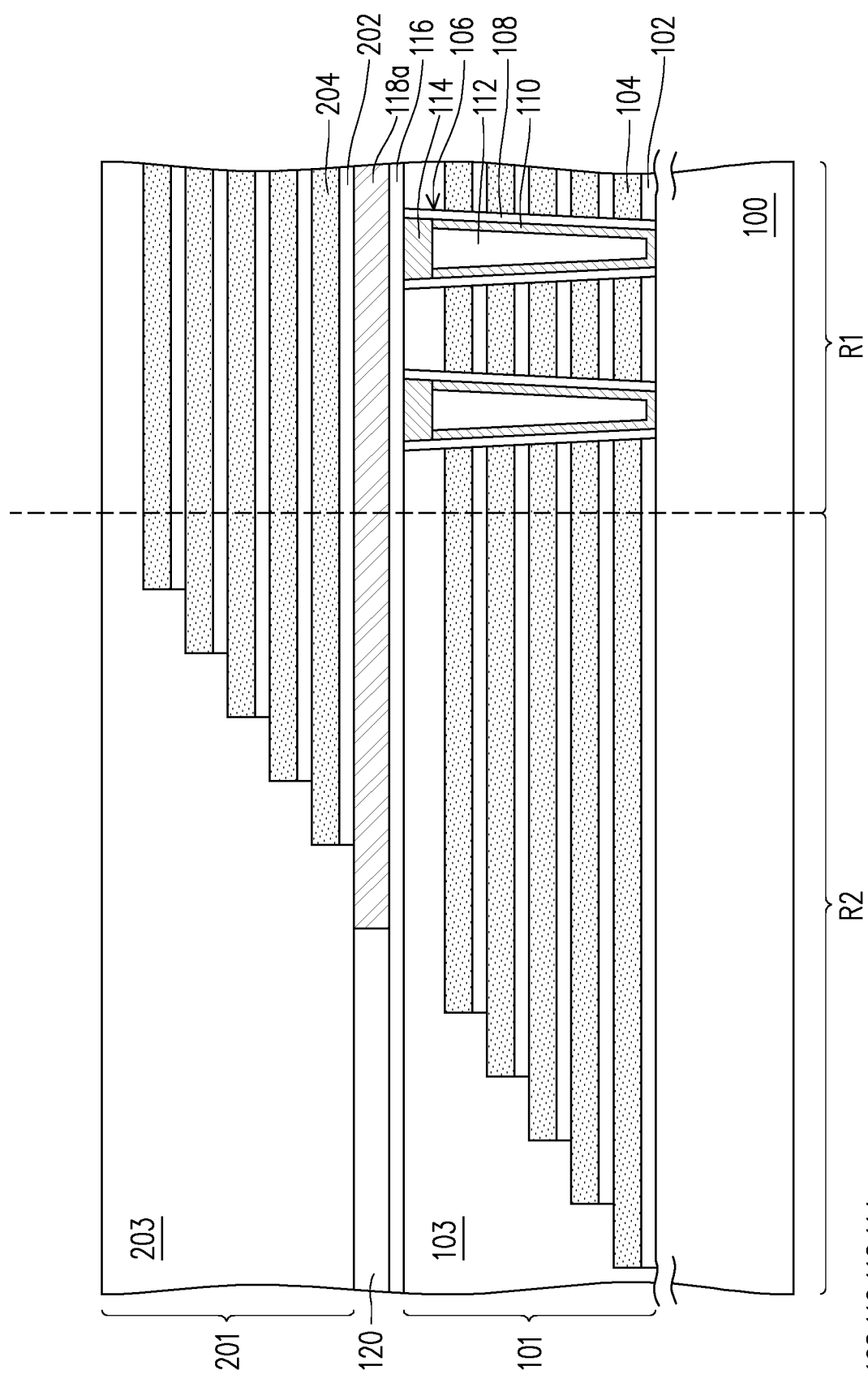

Referring to FIG. 1D, an insulating buffer layer 120 is formed aside the etching stop layer 118a on the periphery region R2. In an embodiment, the material of the insulating buffer layer 120 includes silicon oxide, and the forming method thereof includes performing a chemical vapor deposition process, followed by an etching back process or a chemical polishing process. In an embodiment, the top surface of the insulating buffer layer 120 is substantially coplanar with the top surface of the etching stop layer 118a. In some embodiments, the insulating buffer layer 120 can be optionally omitted.

Thereafter, a second stacked structure 201 is formed on the first stacked structure 101. In an embodiment, the second stacked structure 201 is disposed on the cell region R1 and the periphery region R2. In an embodiment, the second stacked structure 201 includes a plurality of second insulating layers 202 and a plurality of second film layers 204 stacked alternately. In an embodiment, the material of the second insulating layers 202 includes silicon oxide, and the material of the second film layers 204 includes silicon nitride. In an embodiment, the distances of the second film layers 204 protruding from the cell region R1 are decreased as the second film layers 204 are gradually away from the substrate. The end portions of the second film layers 204 and the second insluting layers 202 constitute a second staircase structure. A second stepped insulating layer 203 fill up the other space of the second stacked structure 201. In an embodiment, the distance of the lowermost second film layer 204 protruding from the cell region R1 is less than the distance of the underlying etching stop layer 118a protruding from the cell region R1.

Figure 1E:
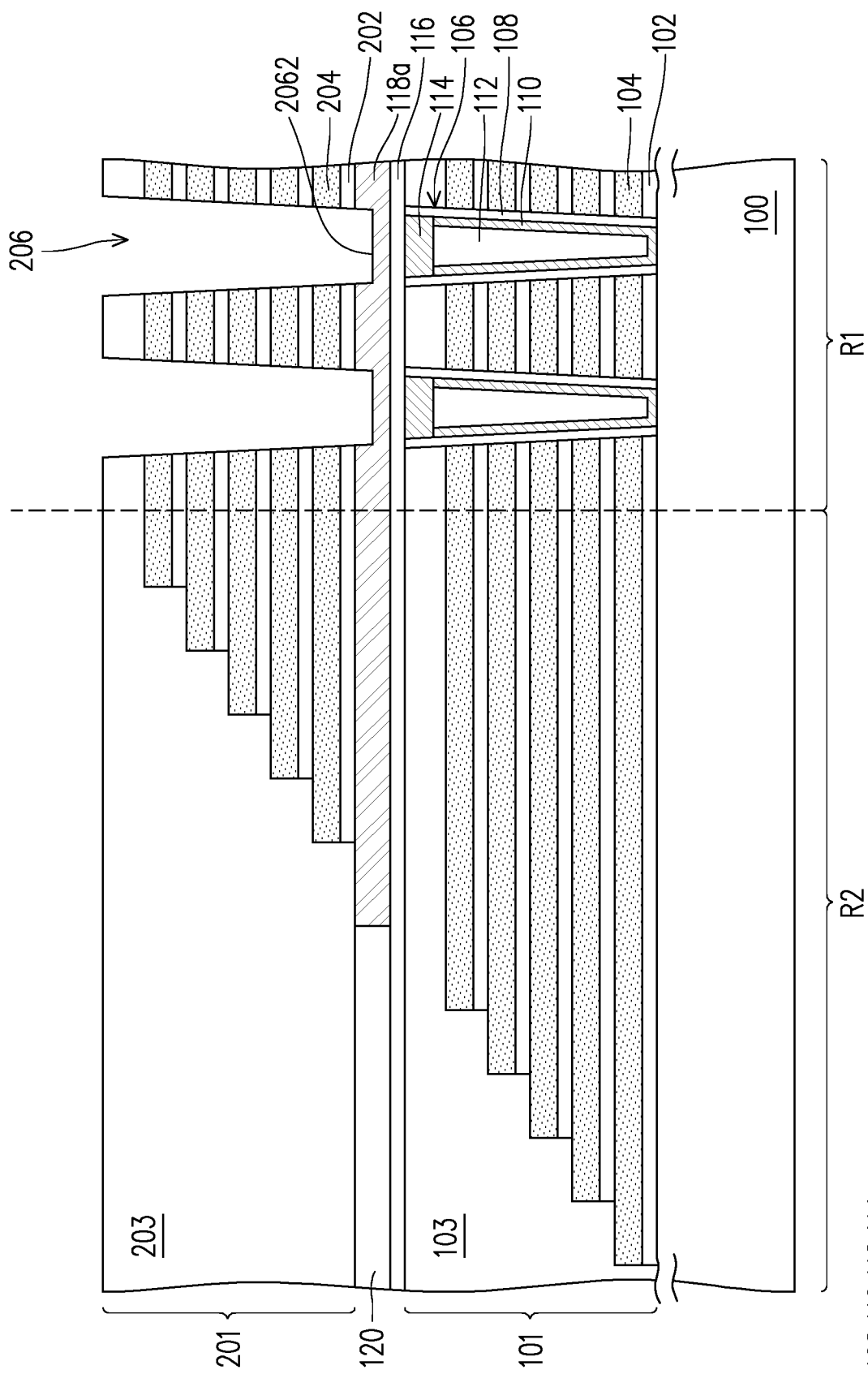

Referring to FIG. 1E, a patterning process is performed, so as to remove a portion of the second stacked structure 201 on the cell region R1, and therefore form one or more second openings 206 penetrating through the second insulating layers 202 and the second film layers 204. In an embodiment, during the patterning process, a portion of the etching stop layer 118a is simultaneously removed, so that the bottom 2062 of the second opening 206 is located in the etching stop layer 118a. In an embodiment, the second opening 206 can have a slightly inclined sidewall, as shown in FIG. 1E. In another embodiment, the second opening 206 can have a substantially vertical sidewall. In an embodiment, the second opening 206 is referred to as a second vertical channel (VC) hole.

Figure 1F:
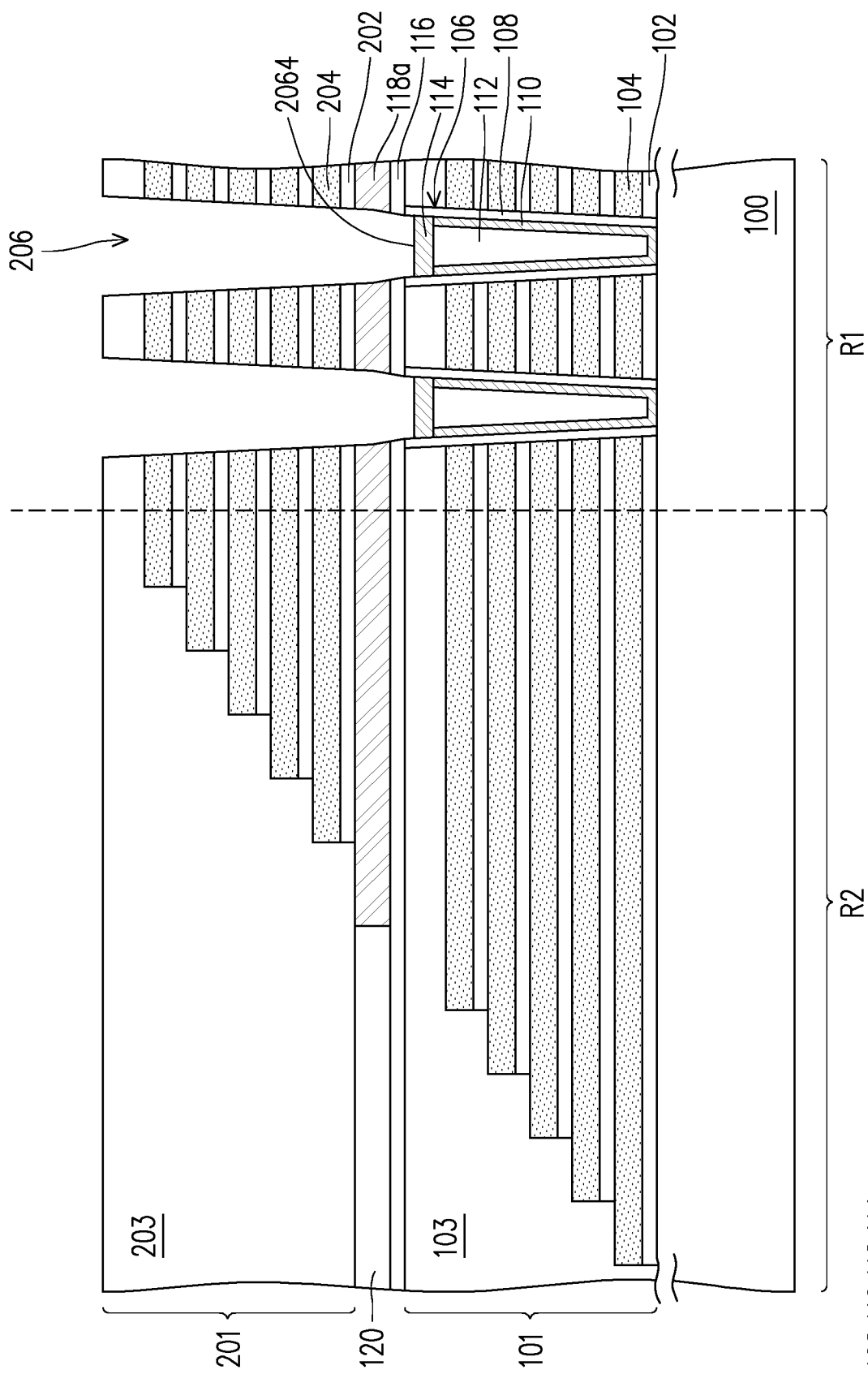

Referring to FIG. 1F, the second opening 206 is deepened, until the second opening 206 exposes the first conductive plug 114. In other words, the bottom 2064 of the second opening 206 is the surface of the first conductive plug 114. In an embodiment, a first etching step is performed, until the second opening 206 penetrates through the etching stop layer 118a and exposes the underlying insulating liner 116. Afterwards, a second etching step is performed, until the second opening 206 penetrates through the insulating liner 116 and exposes the underlying first conductive plug 114.

Figure 1G:
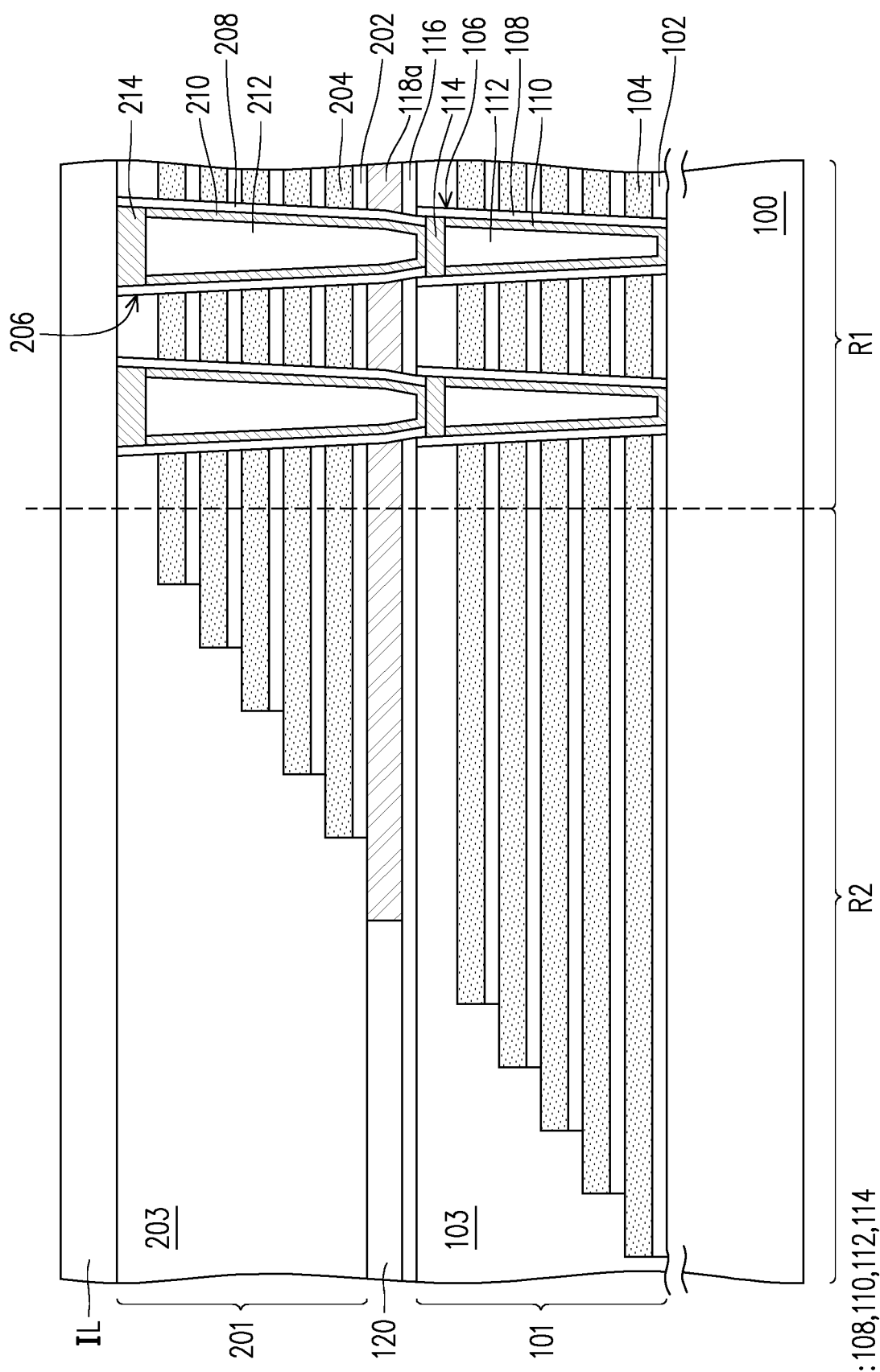

Referring to FIG. 1G, a second charge storage structure 208 is formed on the sidewall of the second opening 206, and the second charge storage structure 208 is in contact with the second insulating layers 202 and the second film layers 204. In an embodiment, the second charge storage structure 208 is an oxide-nitride-oxide (ONO) composite layer. In an embodiment, the second charge storage structure 208 is formed as a spacer on the sidewall of the second opening 206, and exposes the underlying first conductive plug 114.

Thereafter, a second channel layer 210 is formed on the second charge storage structure 208. In an embodiment, the material of the second channel layer 210 includes polysilicon. In an embodiment, the second channel layer 210 covers the second charge storage structure 208 on the sidewall of the second opening 206, and is in contact with the first conductive plug 114 exposed by the bottom surface of the second opening 106.

Afterwards, a second insulating pillar 212 is formed in the lower portion of the second opening 206. In an embodiment, the material of the second insulating pillar 212 includes silicon oxide.

Then, a second conductive plug 214 is formed in the upper portion of the second opening 206, and the second conductive plug 214 is in contact with the second channel layer 210. In an embodiment, the material of the second conductive plug 214 includes polysilicon.

Next, an insulating cap layer IL is formed on the second stacked structure 201. In an embodiment, the material of the insulating cap layer IL includes silicon oxide.

Figure 1H:
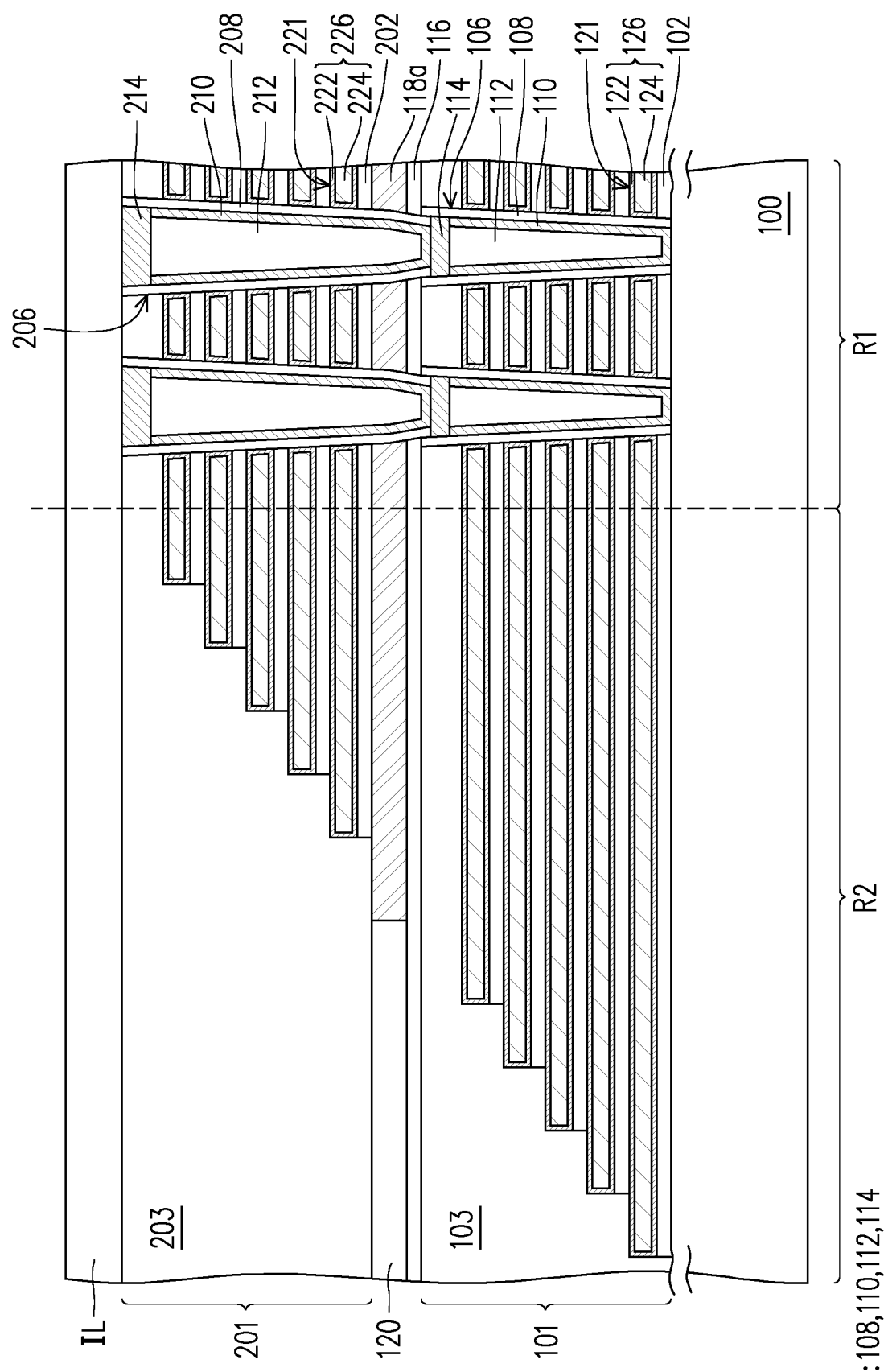

Referring to FIG. 1H, the first film layers 104 are replaced with a plurality of first gate layers 126, and the second film layers 204 are replaced with a plurality of second gate layers 226. In an embodiment, a plurality of vertical openings (not shown) are formed in the first stacked structure 101 and the second stacked structure 201, and the first film layers 104 and the second film layers 204 exposed by the vertical openings are then removed, so as to form a plurality of first horizontal openings 121 that expose a portion of the charge storage structure 108 and form a plurality of second horizontal openings 221 that expose a portion of the second charge storage structure 208.

Thereafter, first gate layers 126 are filled in the first horizontal openings 121, and second gate layers 226 are filled in the second horizontal openings 221. In an embodiment, each of the first gate layers 126 includes a first metal barrier layer 122 and a first metal layer 124, and each of the second gate layers 226 includes a second metal barrier layer 222 and a second metal layer 224. In an embodiment, the material of the first and second metal barrier layers 122 and 222 includes titanium (Ti), titanium nitride (TiN), tantalum (Ta), tantalum nitride (TaN) or a combination thereof, and the material of the first and second metal layers 124 and 224 includes tungsten (W).

Figure 1I:
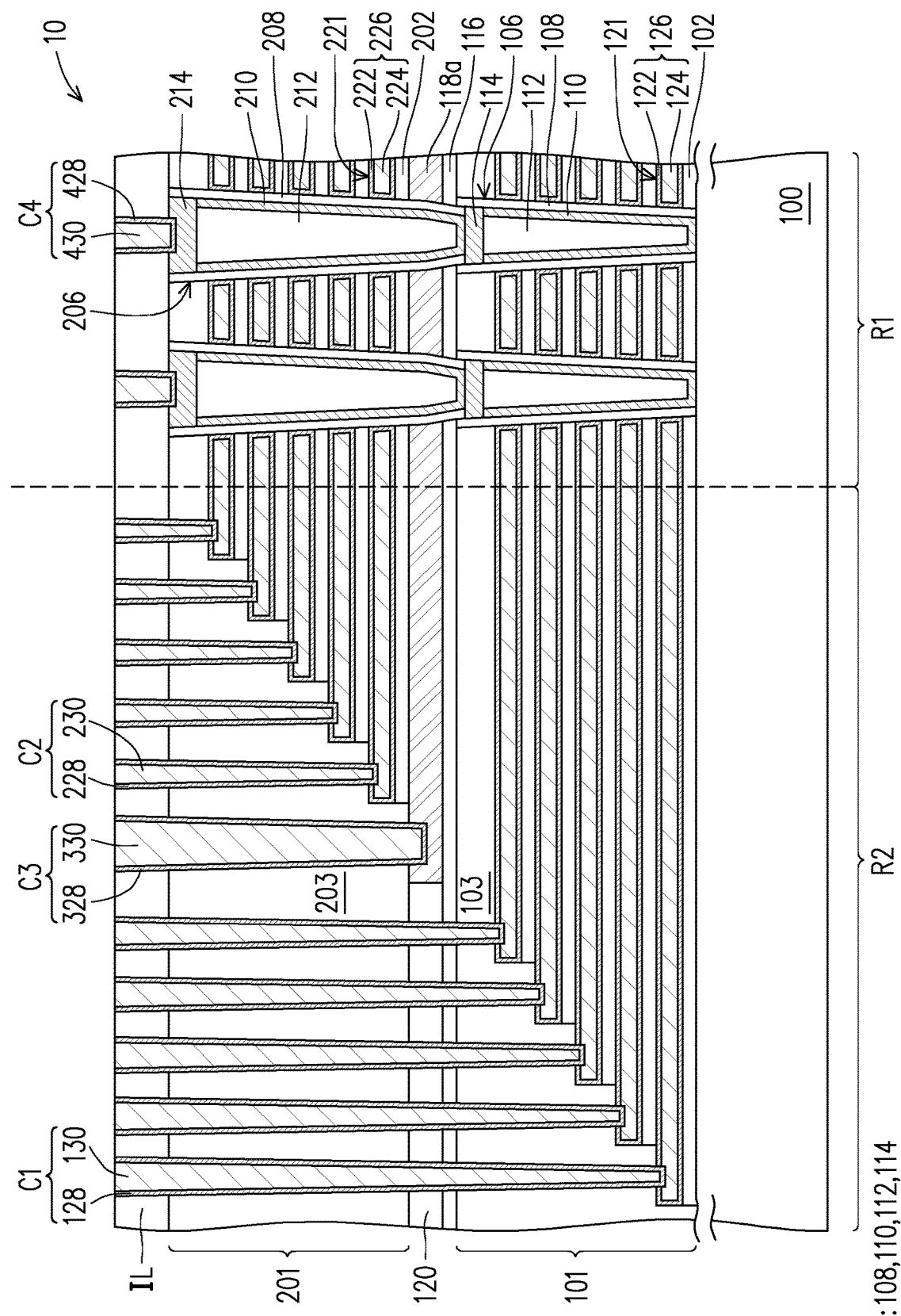

Referring to FIG. 1I, a plurality of first contacts C1 and a plurality of second contacts C2 are formed on the periphery region R2. Specifically, the first contacts C1 penetrate through the insulating cap layer IL and the insulating materials of the first stacked structure 101 and the second stacked structure 201, and are electrically connected to the first gate layers 126. The second contacts C2 penetrate through insulating cap layer IL and the insulating material of the second stacked structure 201, and are electrically connected to the second gate layers 226. In an embodiment, each of the first contacts C1 includes a first barrier layer 128 and a first conductive layer 130, and each of the second contacts C2 includes a second barrier layer 228 and a second conductive layer 230. In an embodiment, the material of the first and second barrier layers 128 and 228 includes titanium (Ti), titanium nitride (TiN), tantalum (Ta), tantalum nitride (TaN) or a combination thereof, and the material of the first and second conductive layers 130 and 230 includes tungsten (W).

In an embodiment, during the formation of the first contacts C1 and the second contacts C2 on the periphery region R2, a third contact C3 is simultaneously formed on the periphery region R2. Specifically, the third contact C3 penetrates through the insulating cap layer IL and the second insulating layers 202 of the second stacked structure 201, and is electrically connected to the etching stop layer 118a. In an embodiment, the third contact C3 includes a third barrier layer 328 and a third conductive layer 330. In an embodiment, the material of the third barrier layer 328 includes titanium (Ti), titanium nitride (TiN), tantalum (Ta), tantalum nitride (TaN) or a combination thereof, and the material of the third conductive layer 330 includes tungsten (W). In an embodiment, the dimension of the third contact C3 is greater than the dimension of the first contacts C1 or the second contacts C2, so as to reduce the resistance value. In another embodiment, the dimension of the third contact C3 is substantially the same as the dimension of the first contacts C1 or the second contacts C2.

In an embodiment, during the formation of the first contacts C1 and the second contacts C2 on the periphery region R2, a fourth contact C4 is simultaneously formed on the cell region R1. Specifically, the fourth contact C4 penetrates through the insulating cap layer IL and the uppermost second insulating layer 202 of the second stacked structure 201, and is electrically connected to the second conductive plug 214. In an embodiment, the fourth contact C4 includes a fourth barrier layer 428 and a fourth conductive layer 430. In an embodiment, the material of the fourth barrier layer 428 includes titanium (Ti), titanium nitride (TiN), tantalum (Ta), tantalum nitride (TaN) or a combination thereof, and the material of the fourth conductive layer 430 includes tungsten (W). The fabrication of the three-dimensional memory device 10 of the invention is thus completed.

The above embodiment in which the etching stop layer 118 includes a conductive material (e.g., polysilicon, tungsten, tungsten silicide or a combination thereof) is provided for illustration purpose, and is not construed as limiting the present invention. In another embodiment, when an etching stop layer 200 includes an insulating material (e.g., aluminum oxide), the step of forming a third contact can be omitted, and a three-dimensional memory device 20 of the invention is thus completed.

In yet another embodiment, when an etching stop layer includes an insulating material (e.g., silicon nitride), an etching stop layer 300 replaces the etching stop layer during the gate replacement step in FIG. 1H, and a three-dimensional memory device 30 of the invention is thus completed. In an embodiment, the etching stop layer 300 includes a metal barrier layer 300a and a metal layer 300b. In an embodiment, the material of the metal barrier layer 300a includes titanium (Ti), titanium nitride (TiN), tantalum (Ta), tantalum nitride (TaN) or a combination thereof, and the material of the metal layer 300b includes tungsten (W).

The structure of the three-dimensional memory device of the invention is illustrated below with reference to FIG. 1I, FIG. 2 and FIG. 3. Each of the three-dimensional memory devices 10, 20 and 30 includes a substrate 100, a first stacked structure 101, a second stacked structure 201 and an etching stop layer 118a (or 200 or 300). The substrate 100 has a cell region R1 and a periphery region R2. The first stacked structure 101 is disposed on the cell region R1 and the periphery region R2, and has at least one first vertical channel pillar 115 on the cell region R1 that penetrates through the first stacked structure 101. The first vertical channel pillar 115 is referred to as a tier-1 vertical channel pillar.

In an embodiment, the first vertical channel pillar 115 includes a first charge storage structure 108 disposed on the sidewall of a first opening 106 that penetrates through the first stacked structure 101, a first insulating pillar 112 disposed in the first opening 106, a first channel layer 110 disposed between the first charge storage structure 108 and the first insulating pillar 112, and a first conductive plug 114 disposed on the first insulating pillar 112 and in contact with the first channel layer 110.

In an embodiment, the first charge storage structure 108 includes an electrical tunneling layer, a charge trapping layer, a charge blocking layer, or a combination thereof (not shown). When the second charge storage structure 208 includes an electrical tunneling layer, a charge trapping layer and a charge blocking layer, the materials thereof are an oxide, a nitride, and an oxide, respectively. Each of the first gate layers 126 includes a first metal barrier layer 122 and a first metal layer 124.

The second stacked structure 201 is located on the first stacked structure 101, is disposed on the cell region R1 and the periphery region R2, and has at least one second vertical channel pillar 215 on the cell region R1 that penetrates through the second stacked structure 201. The second vertical channel pillar 215 is referred to as a tier-2 vertical channel pillar. The second vertical channel pillar 215 is electrically connected to first vertical channel pillar 115.

In an embodiment, the second vertical channel pillar 215 includes a second charge storage structure 208 disposed on the sidewall of a second opening 206 that penetrates through the second stacked structure 201, a second insulating pillar 212 disposed in the second opening 206, a second channel layer 210 disposed between the second charge storage structure 208 and the second insulating pillar 212, and a second conductive plug 214 disposed on the second insulating pillar 212 and in contact with the second channel layer 210.

In an embodiment, the second charge storage structure 208 includes an electrical tunneling layer, a charge trapping layer, a charge blocking layer, or a combination thereof (not shown). When the second charge storage structure 208 includes an electrical tunneling layer, a charge trapping layer and a charge blocking layer, the materials thereof are an oxide, a nitride, and an oxide, respectively. Each of the second gate layers 226 includes a second metal barrier layer 222 and a second metal layer 224.

Each of the etching stop layers 118a, 200 and 300 is located between the first stacked structure 101 and the second stacked structure 201, is disposed on the cell region R1 and extends on the periphery region R2, and surrounds the lower portion of the second vertical channel pillar 215.

In an embodiment, each of the three-dimensional memory devices 10, 20 and 30 further includes an insulating liner 116 disposed between the first stacked structure 101 and each of the etching stop layers 118a, 200 and 300. In an embodiment, the thickness of each of the etching stop layers 118a, 200 and 300 is at least two times the thickness of the insulating liner 116.

In an embodiment, the three-dimensional memory device 10 (or 20 or 30) further includes an insulating buffer layer 120 disposed on the insulating liner 116 and aside the etching stop layer 118a (or 200 or 300).

In an embodiment, the first stacked structure 101 includes a plurality of first insulating layers 102 and a plurality of first gate layers 126 stacked alternately, the second stacked structure 201 includes a plurality of second insulating layers 202 and a plurality of second gate layers 226 stacked alternately, and the portions of the first gate layers 126 and the second gate layers 226 protruding from the cell region R1 form a staircase structure on the periphery region R2. In an embodiment, the periphery region R2 is referred to as a staircase region.

Specifically, the first stacked structure 101 includes the first insulating layers 102 and the first gate layers 126 stacked alternately, the distances of the first gate layers 126 protruding from the cell region R1 are decreased as the first gate layers 126 are gradually away from the substrate 100. The second stacked structure 201 includes the second insulating layers 202 and the second gate layers 226 stacked alternately, and the distances of the second gate layers 226 protruding from the cell region R1 are decreased as the second gate layers 226 are gradually away from the substrate 100. The distance of the etching stop layer 118a/200/300 protruding from the cell region R1 is between the distance of the adjacent first gate layer 126 protruding from the cell region R1 and the distance of the adjacent second gate layer 226 protruding from the cell region R1.

In an embodiment, the thickness of each of the etching stop layers 118a, 200 and 300 is greater than the thickness of the first gate layers 126 or the second gate layers 226. However, the present invention is not limited thereto. The thickness of each of the etching stop layers 118a, 200 and 300 can be adjusted upon the process requirement. In another embodiment, the thickness of the etching stop layer 118a/200/300 can be equal to or less than the thickness of the first gate layers 126 or the second gate layers 226.

In an embodiment, when the material of the etching stop layer 118 is aluminum oxide, the thickness thereof is about 300 to 1,500 angstroms. In an embodiment, when the material of the etching stop layer 118 is polysilicon or silicon nitride, the thickness thereof is about 1,500 angstroms.

In an embodiment, the thickness of the etching stop layer 118 is about 3-15 times the thickness of the insulating layer 116, about 1.5-7.5 times the thickness of the first insulating layer 102, and about 0.6-3 times the thickness of the first gate layer 126.

In an embodiment, each of the three-dimensional memory devices 10, 20 and 30 further includes a plurality of first contacts C1 located on the periphery region R2 and electrically connected to the first gate layers 126, and a plurality of second contacts C2 located on the periphery region R2 and electrically connected to the second gate layers 226.

In an embodiment, the material of each of the etching stop layers 118a and 300 includes polysilicon, tungsten, tungsten silicide, titanium nitride or a combination thereof. In an embodiment, each of the three-dimensional memory devices 10 and 30 further includes a third contact C3 located on the periphery region R2 and electrically connected to the etching stop layer 118a or 300. In an embodiment, the third contact C3 is at a floating potential. In another embodiment, the third contact C3 is at an operating potential, so each of the etching stop layers 118a and 300 can serve as an auxiliary electrode. The potential of the third contact C3 can be determined according to the electrical requirement of the device. In an embodiment, the dimension of the third contact C3 is greater than the dimension of the adjacent first contacts C1 or second contacts C2.

In an embodiment, the material of the etching stop layer 200 includes aluminum oxide. In this embodiment, a third contact is not required for the three-dimensional memory device 20. Besides, the etching stop layer 200 can be a single-layer or multi-layer structure as needed.

In an embodiment, each of the three-dimensional memory devices 10, 20 and 30 further includes a fourth contact C4 located on the cell region R1 and electrically connected to the second vertical channel pillar 215.

The above embodiments in which the first film layers 104 and the second film layers 204 are first silicon nitride sacrificial layers and second silicon nitride sacrificial layers, respectively, and are subsequently replaced with the first gate layers 126 and the second gate layers 226 are provided for illustration purposes only, and are not construed as limiting the present invention. In other embodiments, the first film layers and the second film layers can be first polysilicon layers and second polysilicon layers, respectively, and the gate replacement step in FIG. 1H can be omitted.

Figure 4:
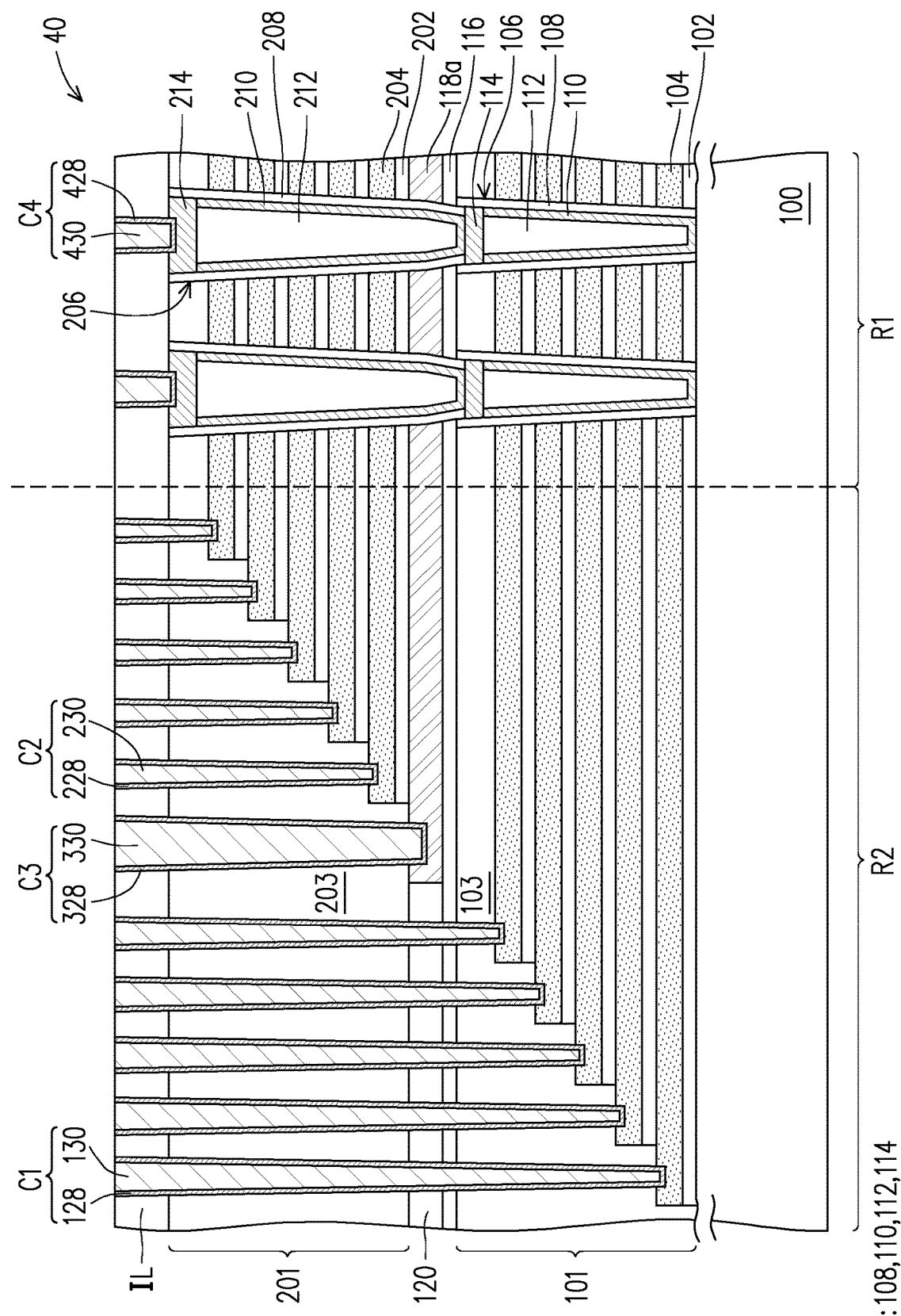
FIG. 4 is a schematic cross-sectional view of a three-dimensional memory device according to an embodiment of the present invention.
Figure 5:
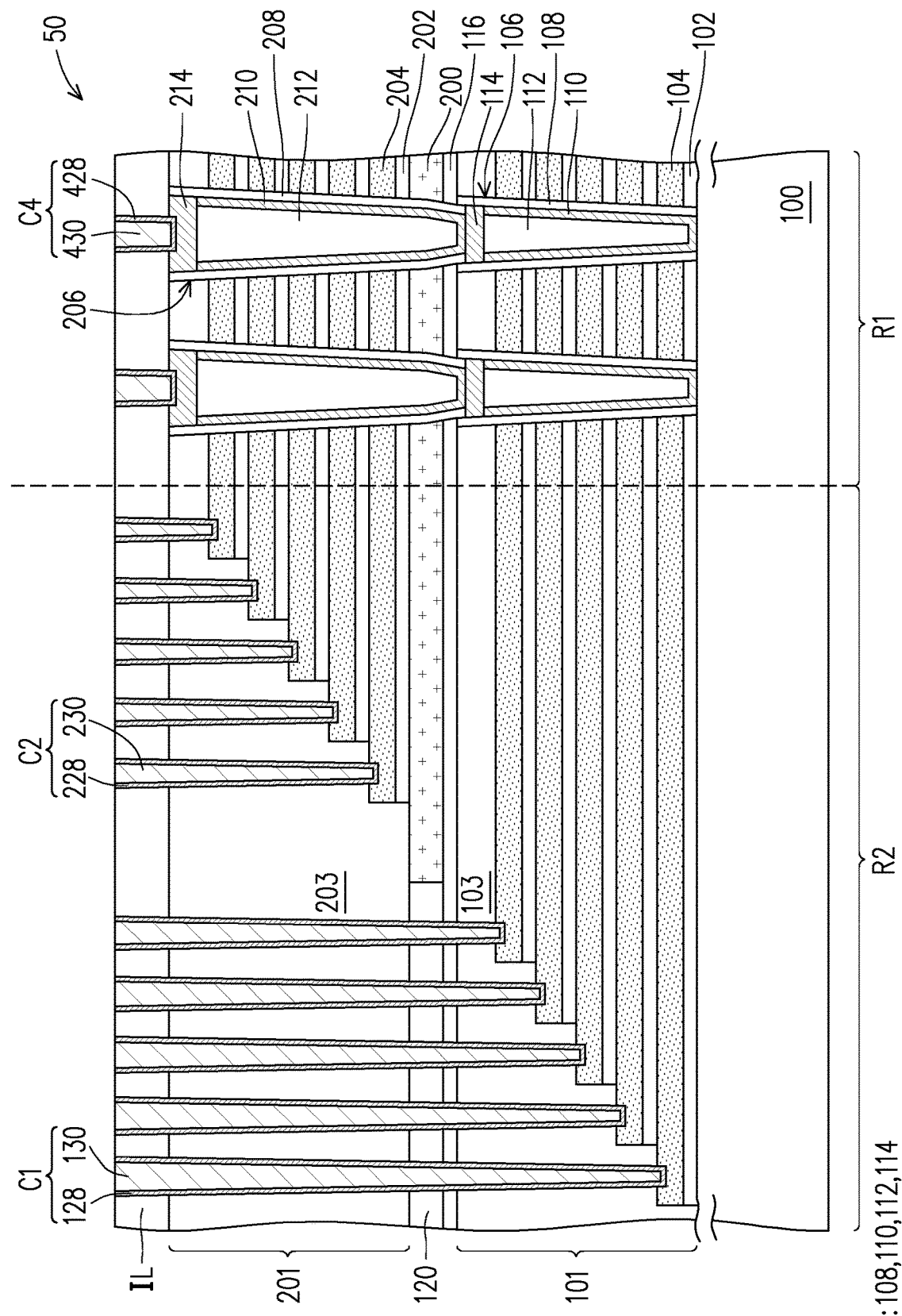
FIG. 5 is a schematic cross-sectional view of a three-dimensional memory device according to another embodiment of the present invention.

FIG. 4 is a schematic cross-sectional view of a three-dimensional memory device according to an embodiment of the present invention. FIG. 5 is a schematic cross-sectional view of a three-dimensional memory device according to another embodiment of the present invention.

The three-dimensional memory device 40 of FIG. 4 is similar to the three-dimensional memory device 10 of FIG.

1I, and the difference between them lies in that, the positions of the first gate layers 126 and the second gate layers 126 of FIG. 1I are still the first film layers 104 (first polysilicon layers) and the second film layer layers 204 (second polysilicon layers).

The three-dimensional memory device 50 of FIG. 5 is similar to the three-dimensional memory device 20 of FIG. 2, and the difference between them lies in that, the positions of the first gate layers 126 and the second gate layers 126 of FIG. 2 are still the first film layers 104 (first polysilicon layers) and the second film layer layers 204 (second polysilicon layers).

In an embodiment, the top width of the first vertical channel pillar 115 is greater than the bottom width of the second vertical channel pillar 215. In another embodiment, the top width of the first vertical channel pillar 115 is substantially equal to the bottom width of the second vertical channel pillar 215.

In summary, in the three-dimensional memory device of the invention, after forming a first vertical channel pillar, an etching stop layer is formed, and then a second opening for forming a second vertical channel pillar is defined. The etching stop layer of the invention can widen the process window of the second opening, so as to avoid the etching damage to the underlying first vertical channel pillar caused by misalignment of the second opening, and therefore improve the device performance. In addition, the etching stop layer of the invention can be set as a floating node or an operation node based on the electrical requirement, thereby increasing the design flexibility of the product.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A three-dimensional memory device, comprising:
    a substrate, having a cell region and a periphery region;
    a first stacked structure, disposed on the cell region and the periphery region, and having at least one first vertical channel pillar on the cell region that penetrates through the first stacked structure, wherein the first vertical channel pillar comprises a first conductive plug;
    a second stacked structure, located on the first stacked structure, disposed on the cell region and the periphery region, and having at least one second vertical channel pillar on the cell region that penetrates through the second stacked structure, wherein the second vertical channel pillar is in physical contact with the first conductive plug of the first vertical channel pillar; and
    an etching stop layer, located between the first stacked structure and the second stacked structure, disposed on the cell region and extends onto the periphery region, and surrounding a lower portion of the second vertical channel pillar, wherein a material of the etching stop layer comprises polysilicon, metal, metal silicide, alloy or a combination thereof.

2. The three-dimensional memory device of claim 1, further comprising:
    an insulating liner, disposed between the etching stop layer and the first stacked structure and covering a portion of the first stacked structure, wherein the insulating liner and the etching stop layer are made by different materials.

3. The three-dimensional memory device of claim 2, further comprising:
    an insulating buffer layer, disposed on the insulating liner and aside the etching stop layer.

4. The three-dimensional memory device of claim 2, wherein a thickness of the etching stop layer is at least two times a thickness of the insulating liner.

5. The three-dimensional memory device of claim 1, wherein the first stacked structure comprises a plurality of first insulating layers and a plurality of first gate layers stacked alternately, the second stacked structure comprises a plurality of second insulating layers and a plurality of second gate layers stacked alternately, and portions of the first gate layers and the second gate layers protruding from the cell region form a staircase structure on the cell region.

6. The three-dimensional memory device of claim 5, wherein a thickness of the etching stop layer is greater than a thickness of the first gate layers or the second gate layers.

7. The three-dimensional memory device of claim 5, further comprising:
    a plurality of first contacts, located on the periphery region and electrically connected to the first gate layers; and
    a plurality of second contacts, located on the periphery region and electrically connected to the second gate layers.

8. The three-dimensional memory device of claim 1, further comprising:
    a third contact, located on the periphery region and electrically connected to the etching stop layer.

9. The three-dimensional memory device of claim 8, wherein the third contact is at a floating potential.

10. The three-dimensional memory device of claim 8, wherein the third contact is at an operating potential.

11. The three-dimensional memory device of claim 1, wherein the first stacked structure comprises a plurality of first insulating layers and a plurality of first gate layers stacked alternately, and distances of the first gate layers protruding from the cell region are decreased as the first gate layers are gradually away from the substrate;
    the second stacked structure comprises a plurality of second insulating layers and a plurality of second gate layers stacked alternately, and distances of the second gate layers protruding from the cell region are decreased as the second gate layers are gradually away from the substrate; and
    a distance of the etching stop layer protruding from the cell region is between a distance of the adjacent first gate layer protruding from the cell region and a distance of the adjacent second gate layer protruding from the cell region.

12. The three-dimensional memory device of claim 1, wherein the first vertical channel pillar further comprises:
    a first charge storage structure, disposed on a sidewall of a first opening that penetrates through the first stacked structure;
    a first insulating pillar, disposed in the first opening; and
    a first channel layer, disposed between the first charge storage structure and the first insulating pillar,
    wherein the first conductive plug is disposed on the first insulating pillar and in contact with the first channel layer.

13. The three-dimensional memory device of claim 1, wherein the second vertical channel pillar comprises:
    a second charge storage structure, disposed on a sidewall of a second opening that penetrates through the second stacked structure;

a second insulating pillar, disposed in the second opening;
a second channel layer, disposed between the second charge storage structure and the second insulating pillar; and
a second conductive plug, disposed on the second insulating pillar and in contact with the second channel layer.

14. A manufacturing method of forming a three-dimensional memory device, comprising:
providing a substrate, wherein the substrate has a cell region and a periphery region;
forming a first stacked structure on the substrate on the cell region and the periphery region;
forming at least one first vertical channel pillar through the first stacked structure on the cell region, wherein the first vertical channel pillar comprises a first conductive plug;
forming an etching stop layer on the first stacked structure on the cell region and the periphery region, wherein a material of the etching stop layer comprises polysilicon, metal, metal silicide, alloy or a combination thereof;
forming a second stacked structure on the etching stop layer on the cell region and the periphery region; and
forming at least one second vertical channel pillar through the second stacked structure on the cell region, wherein the second vertical channel pillar is in physical contact with the first conductive plug of the first vertical channel pillar.

15. The manufacturing method of claim 14, wherein the etching stop layer surrounds a lower portion of the second vertical channel pillar.

16. The manufacturing method of claim 14, further comprising forming an insulating buffer layer aside the etching stop layer.

17. The manufacturing method of claim 14, wherein the first stacked structure comprises a plurality of first insulating layers and a plurality of first film layers stacked alternately, and the second stacked structure comprises a plurality of second insulating layers and a plurality of second film layers stacked alternately, and wherein the method further comprises replacing the first film layers with a plurality of first gate layers and replacing the second film layers with a plurality of second gate layers.

* * * * *